United States Patent [19]

Yoshida et al.

[11] 4,352,995
[45] Oct. 5, 1982

[54] PULSE GENERATING CIRCUIT WITH CLOCK PULSE CEASING FEATURE

[75] Inventors: Kazutoshi Yoshida; Ryuji Yano; Kazuhiro Ishida, all of Mobara, Japan

[73] Assignee: Hitachi, Ltd., Tokyo, Japan

[21] Appl. No.: 186,905

[22] Filed: Sep. 15, 1980

[30] Foreign Application Priority Data

Nov. 5, 1979 [JP] Japan .................. 54-142091

[51] Int. Cl.³ .................. H03K 5/05; H03K 13/32
[52] U.S. Cl. .................. 307/265; 328/58; 328/61; 307/270; 307/442; 365/1
[58] Field of Search .......... 307/265, 270, 441, 442, 307/202.1, 200 A, 200 B, 219; 365/1, 7; 328/58, 61

[56] References Cited

U.S. PATENT DOCUMENTS

| | | | |
|---|---|---|---|
| 3,697,879 | 10/1972 | Holliday | 328/61 |
| 3,840,815 | 10/1974 | Masters | 328/58 |
| 4,079,326 | 3/1978 | Williams et al. | 307/265 |
| 4,141,376 | 2/1979 | Frey | 307/265 |

OTHER PUBLICATIONS

Magnetic Bubble Memory Interface Application Notes TIB0203/5, Chevron Design published by Texas Instruments Inc., Jun. 1, 1978.

Primary Examiner—John S. Heyman
Attorney, Agent, or Firm—Charles E. Pfund

[57] ABSTRACT

A pulse generating circuit in ises a clock ceasing detecting circuit and a logic circuit which receives the output of one of the decoders and the output of the detecting circuit. The flip-flop circuit is cleared by the output of the detecting circuit through the logic circuit when the clock signal is ceased by accident.

3 Claims, 5 Drawing Figures

PULSE GENERATING CIRCUIT WITH CLOCK PULSE CEASING FEATURE

BACKGROUND OF THE INVENTION

This invention relates to a pulse generating circuit, particularly to a timing pulse generating circuit which is suitably used for a function current drive circuit for magnetic bubble memory devices.

In the magnetic bubble memory, a local magnetic field caused by a current flowing in the conductor is used to control a magnetic bubble. For example, conductors are used in the generator for generating bubbles and the replicator for replicating the bubbles. These conductors have a small current capacity and they are easy to fuse. Patterns of conductors used in the magnetic bubble memory are formed by etching a vapored metallic film of aluminum, for example, through a mask. Each segment of the conductor pattern has a very small size of 5000 A in thickness and 5 to 10 $\mu$m in width, and hence a small current capacity. On the other hand, a conductor current of 300 to 400 mA is required to generate a bubble. The conductor has a small current capacity, and it will rapidly fuse in about 50 $\mu$s when a current of 400 mA is passed therethrough. The current pulse width in actual operation is controlled to a value of less than 400 ns, and the pulse width should not be increased so as to prevent breakage of conductors in the bubble memory device.

The timing signal for supplying a pulse current to the conductors is produced by counting the clock pulse, decoding the count output, and driving a flip-flop circuit by the decoder output.

A timing circuit for bubble memory devices is disclosed, for example, in a catalog entitled MODIFICATION INSTRUCTIONS FOR 92K CHEVRON MBM CONTROLLER TIMINGS published by Texas Instruments Incorporated on June 1, 1978. In such a circuit, the timing signal is produced by counting the clock pulse, and therefore, if the clock is ceased, the counter stops counting to cause enlargement of the pulse width, resulting in breakage of the conductors which are easy to fuse as mentioned above.

SUMMARY OF THE INVENTION

An object of the present invention is to provide a circuit which protects a fusible load driven by a pulse current.

Another object of the present invention is to provide a pulse generating circuit incorporated with an electrical protection means for protecting a fusible load.

According to the present invention, the above objects can be accomplished by a pulse generating circuit which comprises a clock signal generating circuit, a counter which receives the output of the clock signal generating circuit, first and second decoders for decoding the contents of the counter, a flip-flop circuit having a preset input terminal to which the output signal of the first decoder is supplied, a clear input terminal to which the output signal of the second decoder is supplied, and an output terminal which outputs a pulse signal whose duration is determined by preset input signal and clear input signal, and an electrical circuit means coupled between the clock generating circuit and the clear input terminal of the flip-flop for detecting ceasing of the clock signal and supplying a detected signal to the clear input terminal of the flip-flop circuit.

BRIEF DESCRIPTION OF THE DRAWINGS

Other objects, features and advantages of the present invention will be apparent from the following detailed description taken in conjunction with the accompanying drawings, in which.

DESCRIPTION OF THE PREFERRED EMBODIMENTS

Figure 1:
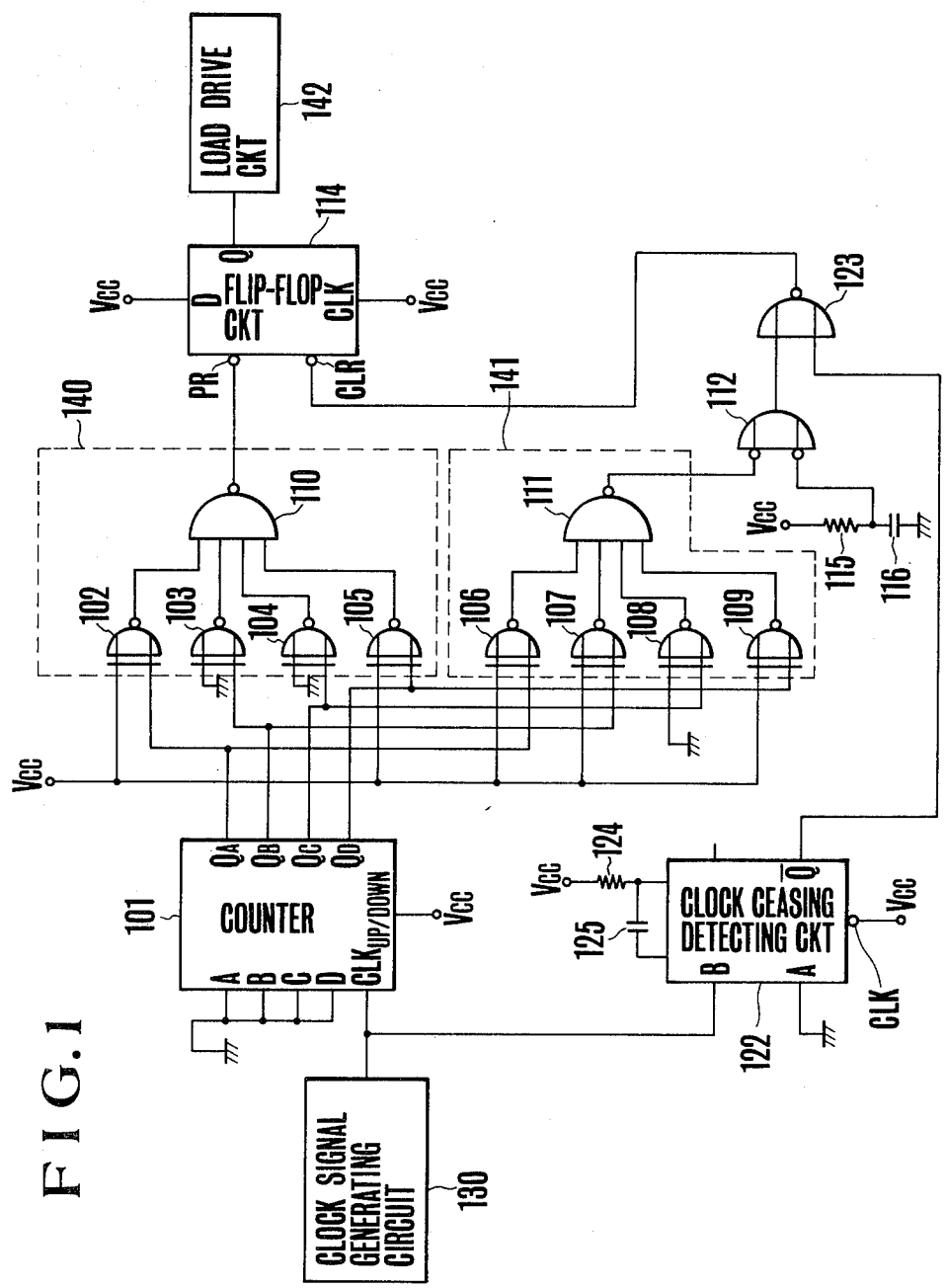
FIG. 1 is a circuit diagram of a pulse generating circuit embodying the present invention.

Referring now to FIG. 1, there is shown a pulse generating circuit embodying the present invention which comprises a counter 101, which is of the type SN74169 manufactured by Texas Instruments Incorporated, for example. This counter 101 receives at its CLK terminal a clock signal from a clock signal generating circuit 130. Since the clock signal generating circuit is well known in the art, explanation thereof will be omitted. Exclusive NOR gates 102, 103, 104 and 105, and an AND gate 110 constitute a decoder 140, and exclusive NOR gates 106, 107, 108 and 109, and an AND gate 111 constitute a decoder 141. The outputs of the counter 101 are coupled to the inputs of the exclusive NOR gates in decoders 140 and 141, and remaining inputs of the exclusive NOR gates are connected so as to set up the decoder function. Terminals A to D of the counter 101 are grounded. In FIG. 1, symbol Vcc signifies the power voltage. Resistor 115 and capacitor 116 form an initial reset circuit which clears a flip-flop circuit 114 when power is initially turned on. That is, immediately after power has been turned on, the junction of resistor 115 and capacitor 116 has a low level voltage, which in turn is supplied through OR gates 112 and 123 to the clear input terminal of the flip-flop circuit 114 to clear the same.

The pulse generating circuit shown in FIG. 1 is identical to that of the above-mentioned timing circuit manufactured by Texas Instruments Incorporated except for an electrical load protection means coupled between clock generating circuit 130 and the clear input of flip-flop 114 and activated at the time of abnormal operation. Operation of the pulse generating circuit in normal operation will be explained first by referring to a timing chart as shown in FIG. 3.

Figure 3:
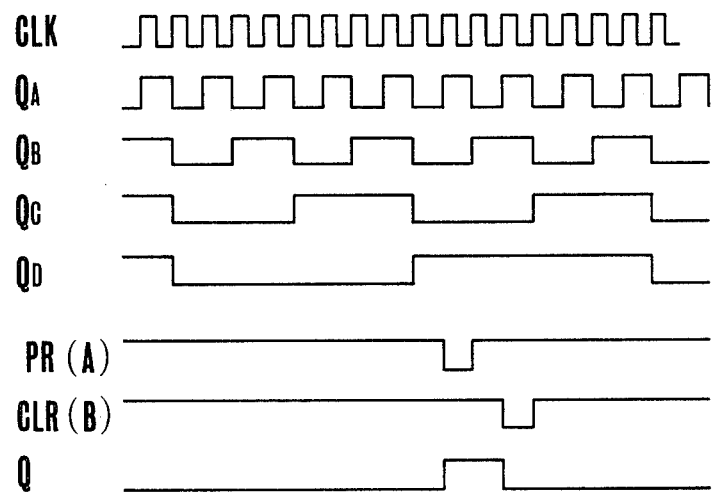
FIG. 3 is a timing chart explaining normal operation of the pulse generating circuit of FIG. 1.

The clock signal CLK in FIG. 3 is the output signal of clock generating circuit 130, and it is counted down by counter 101, so that pulses $Q_A$, $Q_B$, $Q_C$ and $Q_D$ are obtained at outputs $Q_A$, $Q_B$, $Q_C$ and $Q_D$ of the counter 101. Since initial set values of NOR gates 102, 103, 104 and 105 are "H", "L", "L" and "H" levels, the outputs of the respective exclusive NOR gates become "H" level when the decoder 140 has a decoder signal state corresponding to outputs $Q_A$, $Q_B$ $Q_C$ and $Q_D$ of the counter 101 of "H", "L", "L" and "H", and output pulse signal PR(A) of the AND gate 110 then becomes "L". In the same manner, the decoder 141 is provided with initial set values "H", "H", "L" and "H", so that its output pulse signal CLR(B) becomes "L" when outputs $Q_A$, $Q_B$, $Q_C$ and $Q_D$ of the counter 101 are "H", "H", "L" and "H", respectively. The outputs of decoders 140 and 141 are coupled to the preset and clear inputs of the flip-flop circuit 114, causing it to output a pulse Q at its output terminal Q with a duration determined by the decoder output pulses PR(A) and CLR(B), and the output pulse Q is supplied to a load drive circuit 142. For flip-flop 114, an SN7474 manufactured by Texas Instruments Incorporated, for example, can be used.

Figure 2:
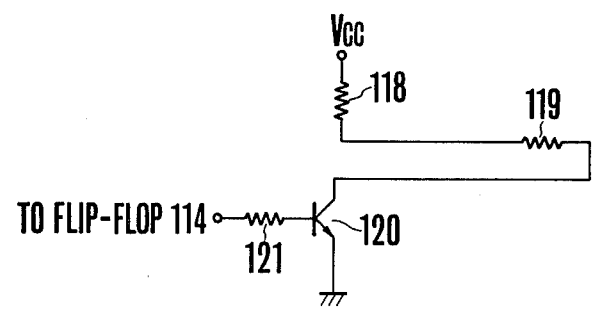
FIG. 2 is a circuit diagram showing an example of load drive circuit.

FIG. 2 shows an example of load drive circuit which is loaded with a conductor 119 of magnetic bubble memory device and current limiting resistor 118 coupled in series to the conductor 119. When a pulse Q from the flip-flop 114 is supplied through a resistor 121 to the base of a transistor 120, the transistor 120 turns on to conduct a current through the conductor 119.

It can be seen from the foregoing description that the counter 101 receives clock signal CLK, and the decoder 140 produces an output PR(A) to preset the flip-flop 114 at a time when the output contents of the counter 101 coincide with the initial set values of the decoder 140, and subsequently the decoder 141 produces an output CLR(B) to clear the flip-flop 114 at a time when the output contents of the counter 101 coincide with the initial set values of the decoder 141. Consequently, the output pulse of flip-flop 114 makes transition from a low level to a high level in response to the pulse PR(A), and from a high level to a low level in response to the pulse CLR(B), so that a pulse Q shown in FIG. 3 is produced.

Figure 4:
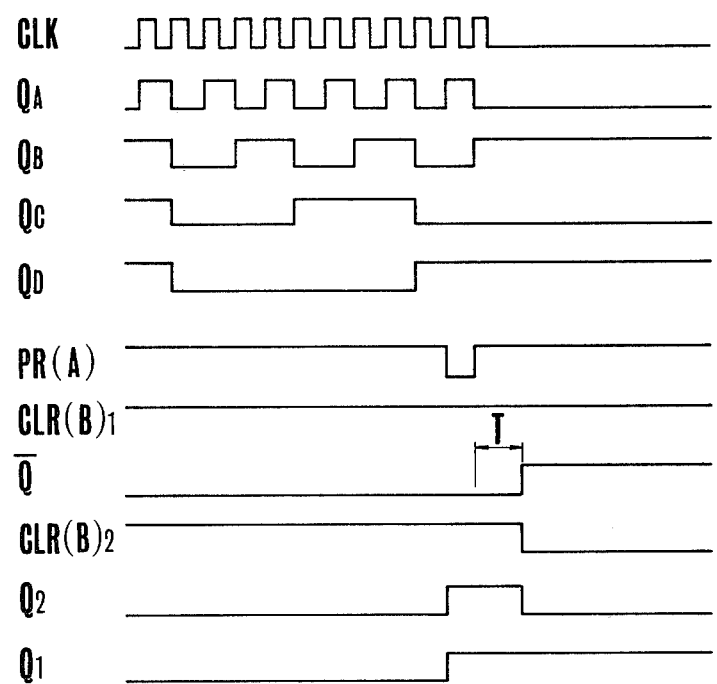
FIG. 4 is a timing chart explaining abnormal operation of the pulse generating circuit of FIG. 1.

In the pulse generating circuit with the above-mentioned circuit arrangement, however, if the clock signal is ceased by accident, the output Q of the flip-flop 114 remains at the high level, resulting in a DC voltage output instead of the pulse signal. More particularly, as shown in FIG. 4, if the clock signal CLK is ceased after the flip-flop 114 has been preset by a PR(A) pulse, say, after generation of the pulse PR(A), the counter 101 does not change the state, and the contents of decoder 141 can not coincide with the contents of counter 101, causing the output of decoder 141 to remain at the high level as shown by CLR(B)1 in FIG. 4, and thus the flip-flop 114 will not be cleared. In this state in which output Q1 of the flip-flop 114 remains high, a DC current is supplied to a fusible load, the conductor of a bubble memory device for example, and it will be broken.

In order to prevent such abnormal operation, an electrical load protection means is coupled between the clock generating circuit 130 and the clear input of flip-flop 114. The electrical means is constructed as follows. The output of the clock generating circuit 130 is coupled to a clock ceasing detecting circuit 122, and an output Q of the detecting circuit 122 is coupled to the other input of OR gate 123 whose one input is coupled through OR gate 112 to the output of decoder 141. The output of the OR gate 123 is coupled to the clear input CLR of the flip-flop 114. That is, the flip-flop 114 receives at its clear input CLR the output of OR gate 123 which receives outputs from decoder 141 and clock ceasing detecting circuit 122. A retriggerable monostable multivibrator of the type SN74123 manufactured by Texas Instruments Incorporated can be used as the clock ceasing detecting circuit 122. The pulse width of the monostable multivibrator 122 is set up using resistor 124 and capacitor 125, so that the pulse width T is slightly longer than the clock period. In the retriggerable monostable multivibrator, the output Q remains "L" while the clock being received consecutively, and when the clock is ceased, the output goes "H" after a time of predetermined pulse width T has elapsed following the last clock pulse. Accordingly, when the clock signal is ceased by accident, the clock ceasing detecting circuit 122 produces a pulse output as shown by Q in FIG. 4, which clears the flip-flop 114 through OR gate 123 as shown by CLR(B)2 in FIG. 4. Thus, even if the decoder 141 does not produce an output due to the ceasing of clock signal CLK, the flip-flop 114 is cleared to make transistion from a high level to a low level as shown by Q2 in FIG. 4, so that generation of a DC output from the flip-flop 114 can be prevented. Therefore, the conductor of a magnetic bubble memory device coupled through the load drive circuit 142 to the output of the flip-flop 114 can be protected from an accidental breakage.

Thus, the pulse generating circuit according to the present invention can be suitably connected to a fusible load, particularly the conductor of magnetic bubble memory devices, through load drive circuit, particularly a function generator current drive circuit.

Figure 5:
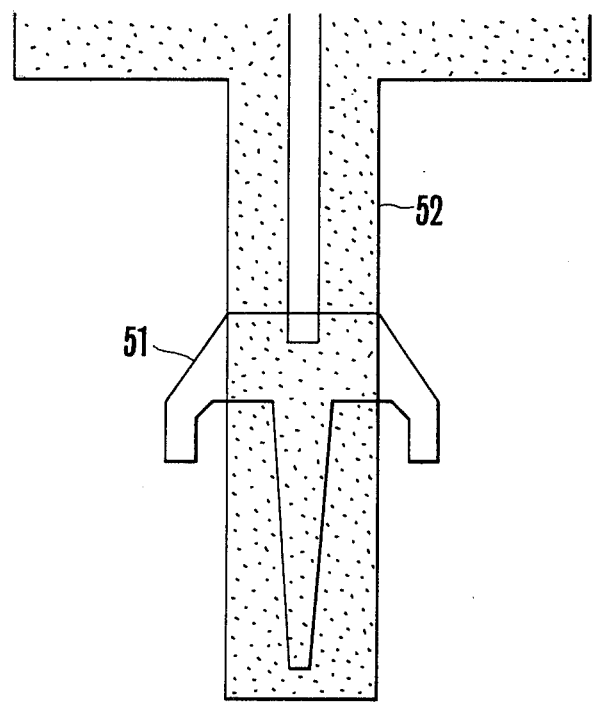
FIG. 5 is a plan view showing an example of function current circuit for a magnetic bubble memory device which is loaded to the pulse generating circuit.

FIG. 5 shows an example of the bubble generator pattern, where reference numeral 51 designates a propagation pattern made of permalloy and 52 a conductor. The conductor 52 is formed by etching a vapored metallic film of aluminum, for example, through a mask and has a very small dimensions of 5000 A in thickness and 5 to 10 $\mu$m is width and a small current capacity. The conductor can be fused by a current of 400 mA in a duration of about 50 $\mu$s; however, such accidental breakage can be prevented by the present invention.

The present invention has been described in its preferred embodiment where the pulse generating circuit is used as a timing pulse generating circuit for the function current drive circuit for magnetic bubble memory device. However, it should be noted that the present invention is not limited to this, but can be applied effectively to a timing generating circuit for semiconductor memory devices, for example.

What is claimed is:

1. A pulse generating circuit comprising:
   a clock signal generating circuit;
   a counter which receives an output of said clock generating circuit;
   first and second decoders for decoding the contents of said counter;
   a flip-flop circuit having a preset input terminal to which an output signal of said first decoder is supplied as an preset input signal, a clear input terminal to which an output signal of said second decoder is supplied as a clear input signal, and an output terminal which delivers a pulse whose duration is determined by said preset input and clear input signals; and
   an electrical circuit means coupled between said clock generating circuit and the clear input terminal of said flip-flop circuit for detecting ceasing of a clock signal and supplying a detected signal to the clear input terminal of said flip-flop circuit.

2. A pulse generating circuit according to claim 1, wherein said electrical circuit means comprises a retriggerable monostable multivibrator with its input terminal coupled to the output of said clock signal generating circuit, and a logic gate with one input terminal coupled to the output of said monostable multivibrator, the other input terminal coupled to the output of said second decoder, and its output terminal coupled to the clear input terminal of said flip-flop circuit.

3. A pulse generating circuit according to claim 1, wherein said circuit further comprises a function current drive circuit coupled to the output of said flip-flop circuit for driving a magnetic bubble memory device, said drive circuit being loaded with a fusible conductor pattern through which the function current is passed.

* * * * *

UNITED STATES PATENT AND TRADEMARK OFFICE
CERTIFICATE OF CORRECTION

PATENT NO. : 4352995
DATED : October 5, 1982
INVENTOR(S) : Yoshida et al.

It is certified that error appears in the above—identified patent and that said Letters Patent is hereby corrected as shown below:

In the Abstract

First line, delete [ises] insert -- which --

Column 1, line 20 delete [A] after 5000 insert -- $\overset{\circ}{\underline{A}}$ --

Column 4, line 28 delete [A] after 5000 insert -- $\overset{\circ}{\underline{A}}$ --

Signed and Sealed this

Fifth Day of April 1983

[SEAL]

Attest:

Attesting Officer

GERALD J. MOSSINGHOFF
Commissioner of Patents and Trademarks